(12) United States Patent
Zheng et al.

(10) Patent No.: US 10,149,079 B2
(45) Date of Patent: Dec. 4, 2018

(54) METHOD OF MANUFACTURING A MEMS MICROPHONE

(71) Applicant: SEMICONDUCTOR MANUFACTURING INTERNATIONAL (SHANGHAI) CORPORATION, Shanghai (CN)

(72) Inventors: Chao Zheng, Shanghai (CN); Weigang Li, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 99 days.

(21) Appl. No.: 14/849,582

(22) Filed: Sep. 9, 2015

(65) Prior Publication Data

US 2016/0088414 A1    Mar. 24, 2016

(30) Foreign Application Priority Data

Sep. 24, 2014    (CN) .......................... 2014 1 0493916

(51) Int. Cl.
*H04R 31/00*        (2006.01)
*H04R 19/00*        (2006.01)
(Continued)

(52) U.S. Cl.
CPC .......... *H04R 31/00* (2013.01); *B81C 1/00801* (2013.01); *H04R 19/005* (2013.01);
(Continued)

(58) Field of Classification Search
CPC ...... H04R 31/00; H04R 19/005; H04R 19/04; H04R 19/01; B81C 1/00626;
(Continued)

(56) References Cited

U.S. PATENT DOCUMENTS 6,308,398 B1 *    10/2001    Beavers ................. H04R 19/04
29/25.35
6,631,558 B2 *    10/2003    Burgess ............. B23K 26/0853
205/125

(Continued)

*Primary Examiner* — Fan Tsang
*Assistant Examiner* — Angelica M McKinney
(74) *Attorney, Agent, or Firm* — Kilpatrick Townsend & Stockton LLP

(57) ABSTRACT

A method of fabricating a micro electrical-mechanical system (MEMS) microphone on a substrate includes forming a sacrificial layer on a front surface of the substrate, forming a membrane within the sacrificial layer, forming a fixed plate on the sacrificial layer at a location corresponding to a location of the membrane, performing a laser cutting on the back surface of the substrate at a location corresponding to an edge region of the fixed plate until a surface of the sacrificial layer is expose to form an opening, forming a patterned photoresist layer on the back surface exposing a region within the boundary of the opening, removing a portion of the back surface using the patterned photoresist layer as a mask to form a cavity, and removing a portion of the sacrificial layer above and below the membrane to form an air gap between the membrane and the fixed plate.

20 Claims, 6 Drawing Sheets

(51) Int. Cl.
 *H04R 19/04* (2006.01)
 *B81C 1/00* (2006.01)
(52) U.S. Cl.
 CPC ...... *H04R 19/04* (2013.01); *B81B 2201/0257* (2013.01); *B81C 2201/014* (2013.01); *B81C 2201/0143* (2013.01); *H04R 2201/003* (2013.01)
(58) Field of Classification Search
 CPC ........ B81C 1/00158; B81C 2201/0143; B81C 2201/0257; B81C 1/00904; B81C 1/00246; B81C 1/00476; B81B 2203/0127; H01L 23/12; B23K 26/0604; H05K 3/0038; C25D 5/022; G03F 7/0035
 See application file for complete search history.

(56) References Cited

U.S. PATENT DOCUMENTS

| | | | | |
|---|---|---|---|---|
| 6,645,851 B1 * | 11/2003 | Ho | ........................ | G03F 7/0035 257/E21.026 |
| 7,485,956 B2 * | 2/2009 | Tuckerman | ............. | H01L 23/06 257/704 |
| 7,936,062 B2 * | 5/2011 | Humpston | .......... | B81C 1/00269 257/680 |
| 8,510,940 B2 * | 8/2013 | Chen | ...................... | C25D 5/022 174/262 |
| 2002/0001960 A1 * | 1/2002 | Wu | ...................... | H01L 21/2815 438/705 |
| 2004/0214112 A1 * | 10/2004 | Cheng | .................. | H01L 21/312 430/322 |
| 2005/0177045 A1 * | 8/2005 | Degertekin | ........ | G01N 29/2406 600/457 |
| 2006/0169677 A1 * | 8/2006 | Deshi | .................. | B23K 26/032 219/121.7 |
| 2009/0152655 A1 * | 6/2009 | Laming | ............... | B81C 1/00246 257/416 |
| 2010/0009550 A1 * | 1/2010 | Tsujikawa | .......... | B23K 26/0604 438/798 |
| 2011/0075866 A1 * | 3/2011 | Zhang | .................... | H04R 1/222 381/174 |
| 2012/0107994 A1 * | 5/2012 | Taya | .................. | B23K 26/0057 438/53 |
| 2013/0001710 A1 * | 1/2013 | Daneman | ................ | H01L 23/10 257/415 |
| 2013/0337648 A1 * | 12/2013 | Lin | ....................... | H01L 21/486 438/675 |

\* cited by examiner

METHOD OF MANUFACTURING A MEMS MICROPHONE

CROSS-REFERENCES TO RELATED APPLICATIONS

This application claims priority to Chinese patent application No. 201410493916.5, filed on Sep. 24, 2014, the content of which is incorporated herein by reference in its entirety.

BACKGROUND OF THE INVENTION

The present invention relates to a micro electromechanical system (MEMS) microphone, a manufacturing method thereof, and an electronic device containing the same.

MEMS microphones are one of the most successful MEMS products, which are compatible with existing integrated circuits manufacturing techniques. MEMS microphones can be manufactured by using process techniques of semiconductor devices. Thanks to the continuous development of CMOS process technology, MEMS microphones can be made very small and have been used in a variety of wearable communication devices including mobile phones, tablet PCs, notebooks, still cameras, video cameras, hearing aids and others.

MEMS microphones can generally be capacitive microphones including a vibrating membrane (lower electrode) fixedly formed on a substrate and facing an opening disposed on a backside of the substrate, and a fixed plate (upper electrode) being suspended above the vibrating membrane. A sealed cavity is disposed between the vibrating membrane and the fixed plate. A MEMS microphone enables detection of a capacitive value change due to the displacement of the vibrating membrane in the sealed cavity, and the detected value change is then processed. However, a MEMS microphone is sensitive to signal interference so that a solution for reducing interference is required.

Current process techniques for manufacturing MEMS microphones employ deep reactive ion etching (DRIE) processes to etch the backside of a substrate to form an opening exposing the vibrating membrane. However, due to the large etched depth caused by deep reactive ion etching, the opening may have poor uniformity, thereby adversely affecting the acoustic signal quality of the microphone and degrading the microphone performance.

FIGS. 1A to 1D are cross-sectional views depicting stages of a conventional method of manufacturing a MEMS microphone according to the prior art.

Referring to FIG. 1A, a MEMS microphone includes a semiconductor substrate 100 having a front side and a backside, a sacrificial layer 101 disposed on the semiconductor substrate, a vibrating membrane 102 within the sacrificial layer, a fixed plate 103 disposed at a region corresponding to the vibrating membrane on the sacrificial layer, and a stopper structure 104 on the sacrificial plate. The stopper structure has multiple stopping elements disposed within sacrificial layer 101.

The MEMS microphone also includes a patterned photoresist layer 105 on the backside of the semiconductor substrate.

Referring to FIG. 1B, a deep reactive ion etching is performed onto the backside of semiconductor substrate 100 using patterned photoresist layer 105 as a mask until a surface of sacrificial layer 101 is exposed to form a cavity 106. Thereafter, patterned photoresist layer 105 is removed.

However, due to the large etch depth formed by the deep reactive ion etching process, cavity 106 may have a non-uniform (uneven) size in the range of about 15%. However, the MEMS microphone is very sensitive to the size variation of cavity 106. The poor uniformity of the cavity size will adversely affect the signal to noise ratio of the microphone, thereby degrading the microphone performance.

Referring to FIG. 1C, a portion of sacrificial layer 101 corresponding to cavity 106 is removed to release vibrating membrane 102, and concurrently form a second cavity 107 between vibrating membrane 102 and fixed plate 103.

Thereafter, the thus formed MEMS microphone is encapsulated in a case 120 (FIG. 1D). The displacement of the vibrating membrane 102 leads to a change in second cavity 107 that produces a signal difference, which is captured and processed by the MEMS microphone.

As described above, the prior art technique does not provide a smooth and uniform surface of the cavity when using a deep reactive ion etching process. The surface of the cavity tends to be uneven and the width of the cavity is non-uniform so that the sensitivity, signal to noise ratio and frequency response of the microphone are adversely affected.

Therefore, what is needed is a method for manufacturing a MEMS microphone that can provide a smooth and uniform cavity for an MEMS microphone.

BRIEF SUMMARY OF THE INVENTION

Embodiments of the present invention provide a method for manufacturing a micro electromechanical system (MEMS) microphone. The method includes providing a semiconductor substrate having a front surface and a back surface, forming a sacrificial layer on the front surface of the semiconductor substrate, forming a membrane within the sacrificial layer, forming a fixed plate on the sacrificial layer at a location corresponding to a location of the membrane, performing a laser cutting on the back surface of the semiconductor substrate at a location corresponding to an edge region of the fixed plate until a surface of the sacrificial layer is exposed to form an opening, forming a patterned photoresist layer on the back surface of the semiconductor substrate exposing a region within a boundary of the opening, removing a portion of the back surface of the semiconductor substrate using the patterned photoresist layer as a mask until the surface of the sacrificial layer is exposed to form a cavity, and removing a portion of the sacrificial layer disposed above and below a center region of the membrane to form an air gap between the membrane and the fixed plate.

In one embodiment, the method further includes, prior to performing the laser cutting, defining a laser cut mark on the back surface of the semiconductor substrate, the laser cut mark is configured to mark the location corresponding to the edge region of the fixed plate.

In one embodiment, the laser cutting is performed at a depth in a range between 370 um and 390 um, with a laser beam power ranging between 0.4 W and 4 W and at a temperature of about 2000° C.

In one embodiment, removing the portion of the back surface of the semiconductor substrate includes a dry etching process. The dry etching process may be a deep reactive ion etching process.

In one embodiment, the cavity has a cylindrical shape.

In one embodiment, the membrane and the fixed plate each include a conductive material. The conductive material may include one of aluminum, tungsten, copper, doped polysilicon, amorphous silicon, and silicon germanium.

In one embodiment, the fixed plate includes a plurality of portions that are spaced apart from each other.

In one embodiment, the method may further includes forming a stopper structure in the plurality of spaced apart portions of the fixed plate, the stopper structure having a portion extending into the sacrificial layer.

In one embodiment, forming the membrane may include forming a membrane material layer in a first sacrificial layer, patterning the membrane material layer, and forming a second membrane layer on the patterned membrane material layer.

In one embodiment, the opening has a circular shape and a width in the range between 3 um and 5 um.

In one embodiment, removing the portion of the sacrificial layer disposed above and below the center region of the membrane comprises a TMAH wet etching process including a TMAH solution having a concentration of 0.1% to 10% by mass, at a temperature in the range between 25° C. to 29° C., and an etch time in a range between about 10 seconds and about 1000 seconds.

Embodiments of the present invention also provide a MEMS microphone that is manufactured by the above-described method. The thus manufactured MEMS microphone has a cavity that advantageously includes a smooth surface and uniform width so that the MEMS microphone has improved signal to noise ratio and acoustic performance.

The following description, together with the accompanying drawings, will provide a better understanding of the nature and advantages of the claimed invention.

DETAILED DESCRIPTION OF THE INVENTION

Figure 1A:
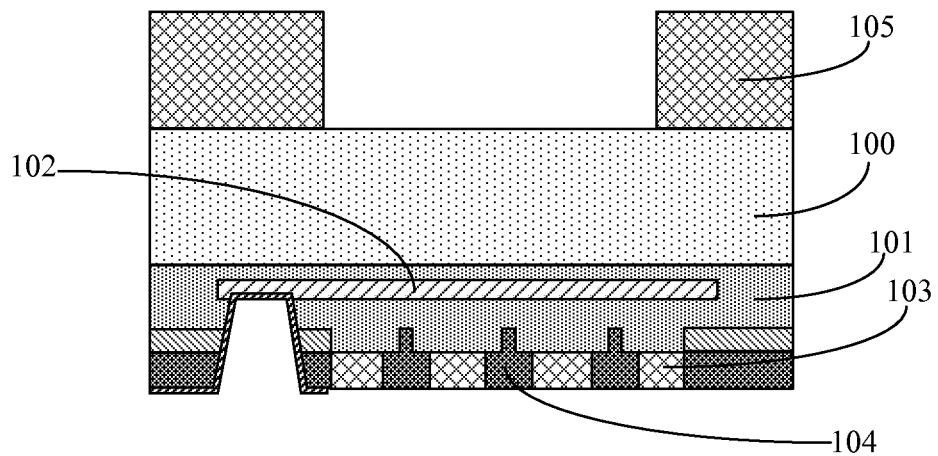
FIGS. 1A to 1D are cross-sectional views depicting stages of a method of manufacturing a MEMS microphone according to the prior art.
Figure 1B:
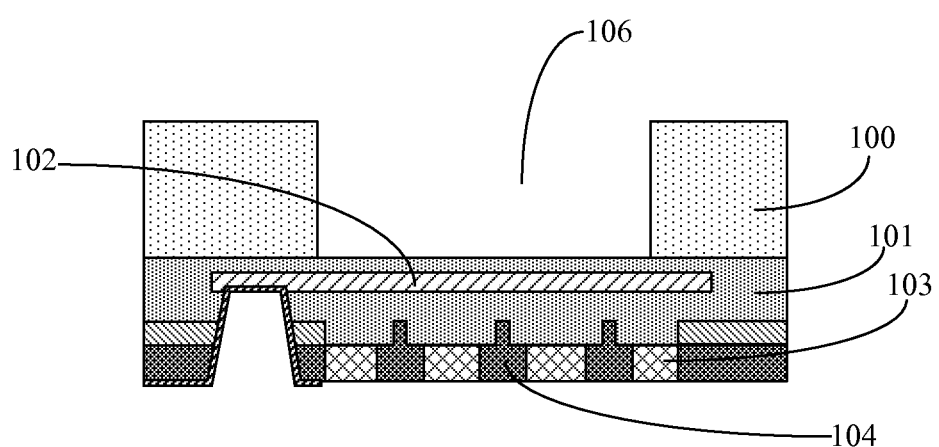
Figure 1C:
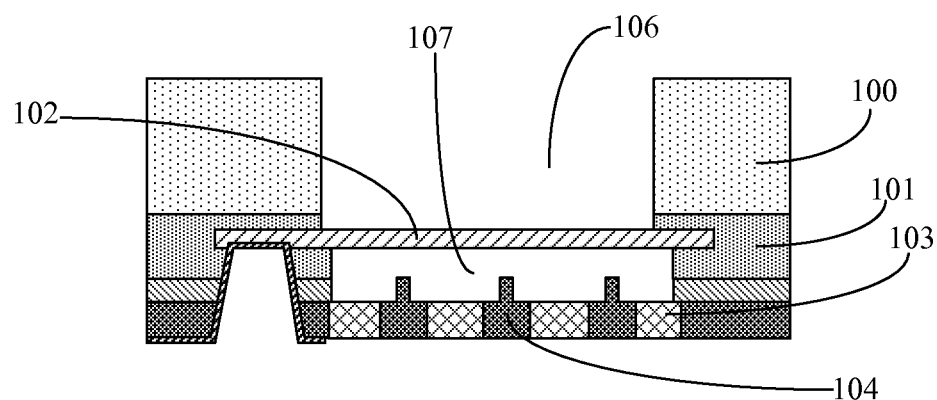
Figure 1D:
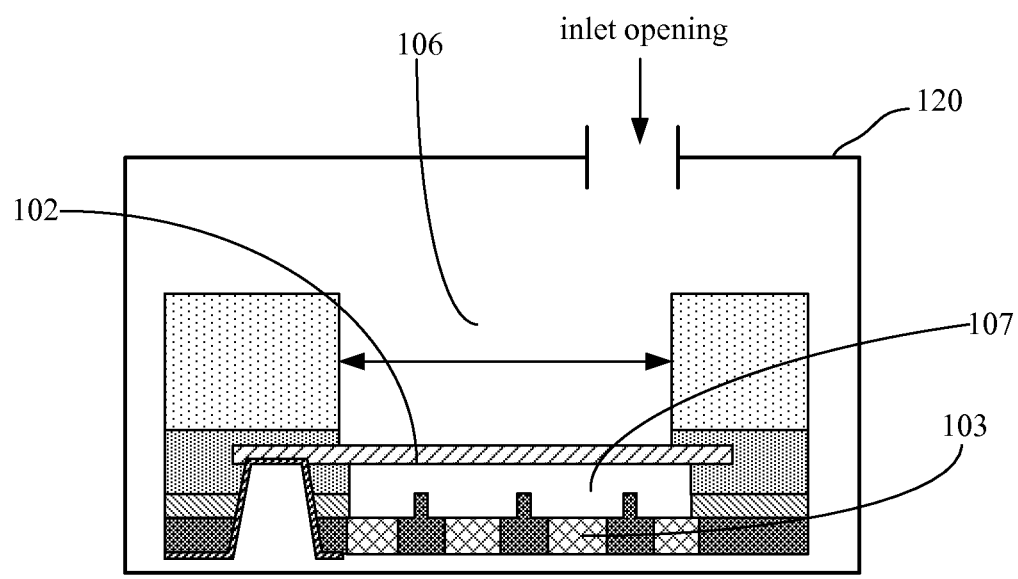

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on" "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

The term "vertical" as used in this application is defined as a plane perpendicular to the conventional plane or surface of a wafer or substrate, regardless of the orientation of the wafer or substrate. Tee "horizontal" refers to a direction perpendicular to the vertical as defined above.

Embodiments of the invention are described herein with reference to cross-section illustrations that are schematic illustrations of idealized embodiments (and intermediate structures) of the invention.

Embodiment 1

FIGS. 2A to 2F are simplified cross-sectional views illustrating stages of process steps of forming a MEMS microphone according to an embodiment of the present invention. FIG. 3 is a simplified flow chart of a method for fabricating a MEMS microphone according to an embodiment of the present invention.

With reference to FIGS. 2A-2F and FIG. 3, a method for fabricating a MEMS microphone may include the following steps:

Step 301: provide a semiconductor substrate.

Figure 2A:
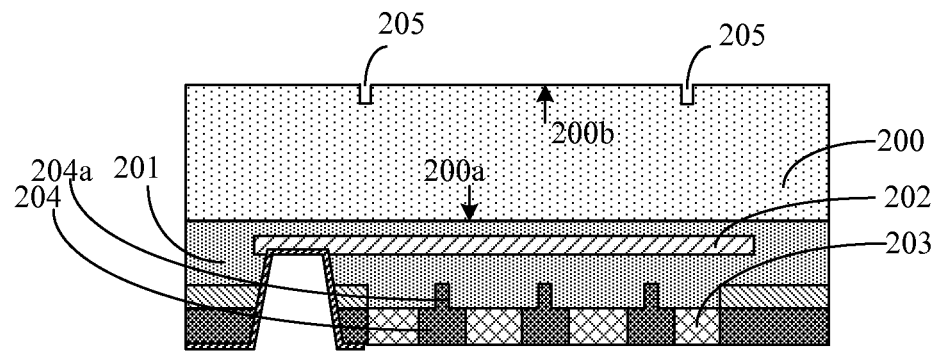
FIGS. 2A to 2F are cross-sectional views depicting stages of a method of manufacturing a MEMS microphone according to an embodiment of the present invention.
Figure 3:
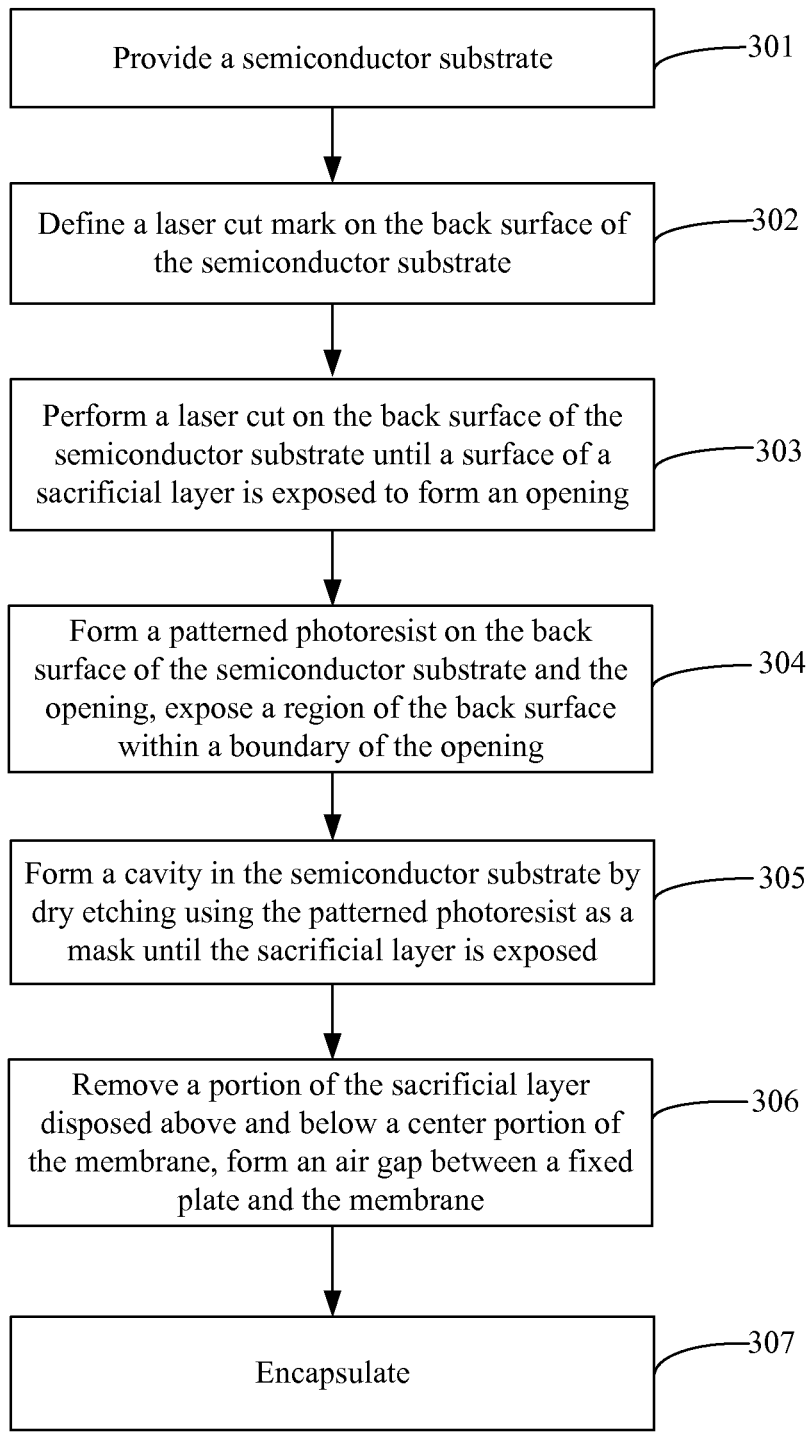
FIG. 3 is a simplified flow chart of a method for manufacturing a MEMS microphone according to an embodiment of the present invention.

Referring to FIG. 2A, a semiconductor substrate 200 is provided. Semiconductor substrate 200 has a front surface 200a and a back surface 200b. As used herein, the term "front surface" is referred to as the side of the substrate where one or more components and/or layers are formed thereon. The opposite surface is referred to as the "back surface." A sacrificial layer 201 is formed on the front side of semiconductor substrate 200. A membrane 202 is formed within sacrificial layer 201, i.e., membrane 202 is surrounded by sacrificial layer 201 on all sides. Membrane 202 is configured to vibrate or move in response to an acoustic wave or pressure. Membrane 202 is alternatively referred to as vibrating membrane hereinafter. A fixed plate 203 having a number of spaced-apart portions is formed on sacrificial layer 201 at a location corresponding to a location of vibrating membrane 202. A stopper structure 204 is formed on sacrificial layer 201 and adjacent to the spaced-apart portions of fixed plate 203. Stopper structure 204 has a number of travel distance limiting elements 204a disposed in (protruding into) sacrificial layer 201. Stopper structure 204 is configured to limit the travel distance of membrane 202 in the vertical direction relative to the surface of the semiconductor substrate and prevent membrane 202 from contacting fixed plate 203.

Semiconductor substrate 200 may be one of a silicon substrate, silicon-on-insulation (SOI) substrate, stacked SOI (SSOI), stacked SiGe on insulator (S—SiGeOI), SiGe on insulator (SiGeOI), Ge on insulator (GeOI), and combinations thereof. One or more active regions may be formed in semiconductor substrate 200.

Sacrificial layer 201 may include a material having a higher etching selection ratio than vibrating membrane 202 that is surrounded therefrom. For example, sacrificial layer 201 may include an oxide material, such as a silicon oxide, carbon-doped silicon oxide (SiOC) and other materials having a high etching selection ratio with respect to the vibrating membrane.

In an embodiment, sacrificial layer 201 may be a thermally oxidized silicon oxide, undoped silicon oxide (USG), phosphorous-doped silicon oxide (PSG) or boron phosphorous doped silicon oxide (BPSG) deposited using a plasma enhanced chemical vapor deposition (PECVD) process.

Membrane 202 may be formed of a conductive material, such as Al, W, Cu and other metal. Membrane 202 may also be formed of doped polysilicon, amorphous silicon or SiGe and the like. Vibrating membrane 202 is configured to serve as a lower electrode for the MEMS microphone.

In an exemplary embodiment, vibrating membrane 202, which is surrounded by sacrificial layer 201, can be formed using the following steps: Firstly, a first sacrificial layer is formed on the semiconductor substrate, a layer of a membrane material is formed on the first sacrificial layer, the membrane material layer is then patterned to form vibrating membrane 202. Thereafter, a second sacrificial layer having the same material as that of the first sacrificial layer is formed on vibrating membrane 202. The stack of the first and second sacrificial layers completely surrounds vibrating membrane 202.

A fixed plate 203 having multiple portions that are spaced apart from each other is formed on sacrificial layer 201 to serve as an upper electrode for the MEMS microphone. Fixed plate 203 can be made of an electrically conductive material, such as Al, W, Cu, and other metal, or doped polysilicon, amorphous silicon, and the like. In the embodiment, fixed plate 203 includes polysilicon.

Fixed plate 203 may be formed using the following processes: a conductive material layer is formed on the sacrificial layer, a patterned mask layer is formed on the conductive material layer. The patterned mask layer is used as a mask to etch the conductive material layer and to form multiple spaced-apart portions of fixed plate 203. The mask layer is then removed.

In an exemplary embodiment, a stopper structure 204 is formed within the multiple spaced-apart portions of fixed plate 203 to limit the travel distance of vibrating membrane 202. Stopper structure 204 may include a nitride layer, such as silicon nitride (SiN), but is not limited thereto. In general, stopper structure 204 has a multiple travel distance limiting elements 204a embedded in sacrificial layer 204 and can be formed using any process techniques known to those of skill in the art, and will not be described herein for reasons of brevity. Travel distance limiting elements 204a are configured to prevent membrane 202 from contacting fixed plate 204 when membrane 202 moves toward fixed plate 204 in response to an acoustic wave or pressure.

Step 302: define a laser cut mark on the back surface of the semiconductor substrate.

Referring to FIG. 2A, semiconductor substrate 200 is turned upside down to expose the back surface of semiconductor substrate 200, and a laser cut mark 205 is defined on the back surface of semiconductor substrate 200. In the example shown in FIG. 2A, two laser cut marks are used, but it is understood that the number is arbitrarily chosen for describing the example embodiment and should not be limiting. Laser cut mark 205 is used as reference marks or guiding marks in a subsequent laser cutting process. Laser cut mark 205 is located on the back surface of semiconductor substrate 200 at a location corresponding to an edge region of fixed plate 203. The edge region of fixed plate 203 is a predetermined region of a to-be formed cavity, which will be described in more detail below. In an embodiment, the outer edge of laser cut mark 205 is aligned with the edge of the predetermined region of the to-be formed cavity, in order to control the dimension of the cavity. Laser cut mark 205 may be a trench or trough in an embodiment.

Step 303: perform a laser cutting on the back surface of the semiconductor substrate until a surface of the sacrificial layer is exposed to form an opening.

Figure 2B:
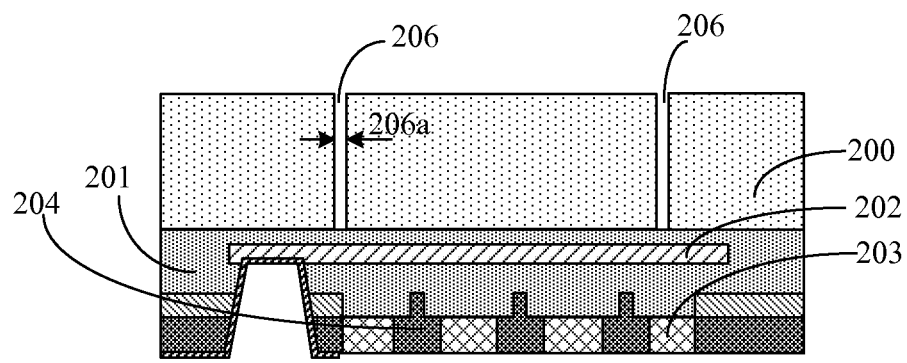

Referring to FIG. 2B, a laser cutting operation is performed on the back surface of semiconductor substrate 200 using laser cut mark 205 as a starting position until a surface of sacrificial layer 201 is exposed to form an opening 206. Opening 206 defines the edge region (boundaries) of fixed plate 203, i.e., a predetermined region of a to-be formed cavity. There are no special requirements on a laser cutting machine or tool, i.e., any standard industrial laser cutting machine can be used to perform the laser cutting process by adjusting the laser power and the stage moving speed to control the depth and width of opening 206. In an embodiment, opening 206 has a depth between 370 um and 390 um (microns) and a width 206a between 3 um and 5 um. It is to be understood that the dimension of the laser cutting depth and width are merely exemplary, the dimension of the laser cutting depth depends on the thickness of the semiconductor substrate, the depth of the cut varies with different thicknesses of the semiconductor substrate while the width can be adjusted according to actual requirements of the MEMS microphone. It is noted that, in order to ensure the accuracy of the final dimension of the cavity, the width 206a of opening 206 should not be too large, preferably in the range between 3 um and 5 um. Opening 206 has a uniformly even surface in the vertical direction relative to the surface of the semiconductor substrate. In other words, opening 206 has sidewalls that are substantially vertical relative to the surface of semiconductor substrate 200, and the sidewalls have a smooth surface.

In an embodiment, the laser cutting can be performed using an argon ion laser beam machine tool available from Disco Corporation. The laser cutting is performing with a laser beam power of about 0.4 W to about 4 W and at a temperature of about 2000° C.

Step 304: form a patterned photoresist layer on the back surface of the semiconductor substrate exposing a cavity region within the boundary of opening 206. In other words, the dimension of the cavity region is limited by the dimension of opening 206.

Figure 2C:
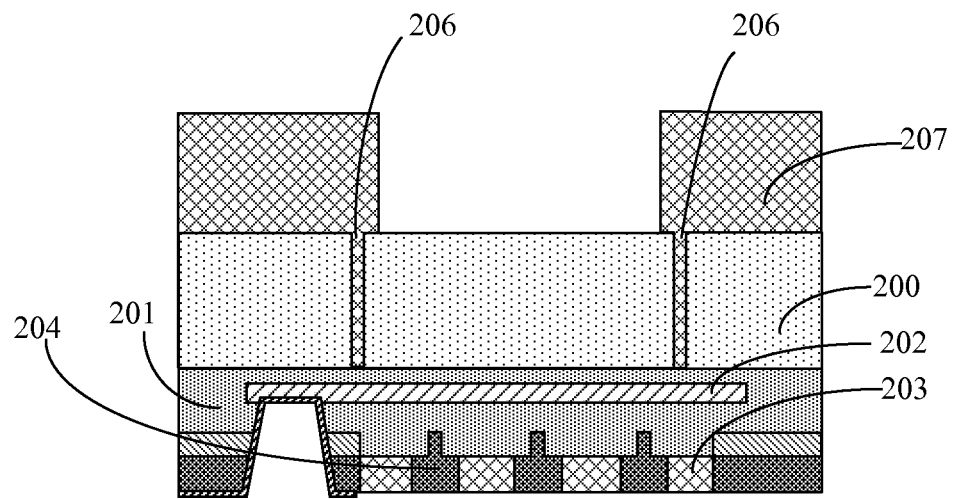

Referring to FIG. 2C, a photoresist layer 207 is formed on the back surface of semiconductor substrate 200, photoresist 207 is exposed to light and then developed to form a patterned photoresist that defines a cavity region. Since semiconductor substrate 200 has a predetermined region of a to-be formed cavity that has been defined by opening 206, only the region defined by the boundary of opening 206 is exposed in this step. Furthermore, patterned photoresist layer 207 can have an opening that is smaller than the predetermined region of the to-be formed cavity so that photoresist layer 207 covers a small portion of the region within the internal boundary of opening 206.

Step 305: remove a portion of the back surface of the semiconductor substrate by dry etching using the patterned photoresist as a mask until a surface of the sacrificial layer is exposed.

Figure 2D:
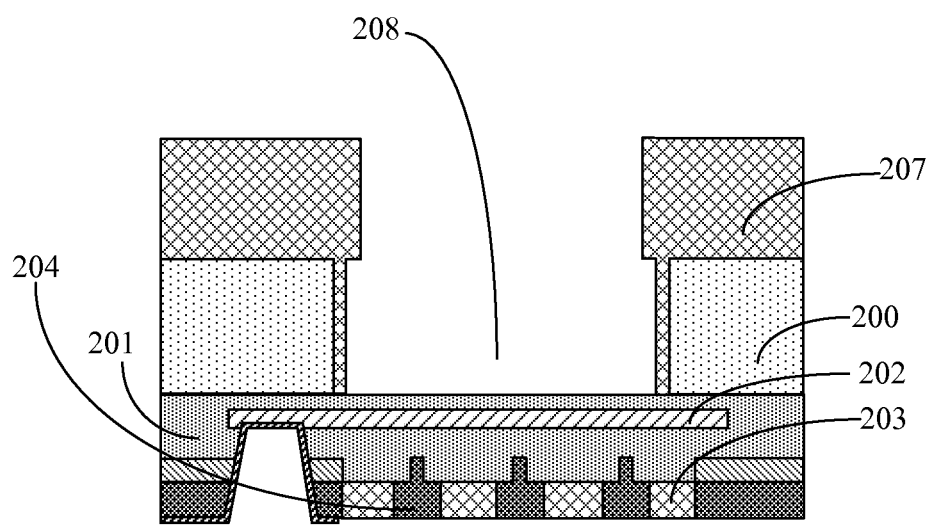

Referring to FIG. 2D, dry etching can be a deep reactive ion etching. In a specific embodiment, deep reactive ion dry etching has a high etching selectivity on semiconductor substrate 200 and low etching selectivity on photoresist layer 207. In an embodiment, deep reactive ion etching includes a sulfur hexafluoride ($SF_6$) as an etchant. The back surface of semiconductor substrate 200 is etched using a dry etching process until a surface of sacrificial layer 201 is exposed to form a cavity 208.

In a subsequent process step, cavity 208 may transmit an external sound pressure or acoustic wave to membrane 202 to cause membrane 202 to move in the direction vertical to the surface of the semiconductor substrate, thereby varying the distance between membrane 202 and fixed plate 203 so that a capacitance value between membrane 202 and fixed plate 203 changes accordingly, and the sound pressure can be measured based on the value change of the capacitance.

Because the lateral surface of opening 206 is formed by laser cutting beam, and opening 206 is filled with patterned photoresist layer 207, so that cavity 208 has a uniform lateral surface after the etching back of the back surface of semiconductor substrate 200 in step 305. Cavity 208 has a cylindrical shape having a uniformly even side surface. In other words, opening 206 has a circular shape.

Step 306: remove a portion of the sacrificial layer disposed above and below the membrane to form a cavity.

Figure 2E:
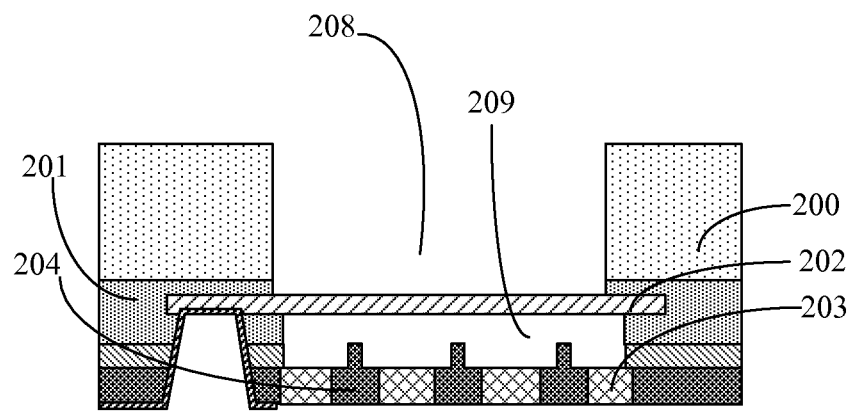

Referring to FIG. 2E, the portion of sacrificial layer 201 above and below the membrane can be removed using a wet etching process containing a tetramethylammonium hydroxide (TMAH) solution when sacrificial layer 201 includes an oxide layer.

In an embodiment, the TMAH wet etching process may include a TMAH solution having a concentration of 0.1% to 10% by mass, at a temperature in the range between 25° C. to 29° C., and an etch time in the range between about 10 s and about 1000 s. In another embodiment, wet etching may include other processes known in the art, such as a HF solution, or a mixed buffered oxide etch (BOE) solution of hydrogen fluoride and ammonium fluoride. After the removal of the portion of sacrificial layer 201 above and below membrane 202, a cavity (air gap) 209 is formed between membrane 202 and fixed plate 203. A MEMS microphone structure is thus obtained, as shown in FIG. 2E. After the portion of sacrificial layer 201 has been removed, portions of sacrificial layer 201 adjacent to cavity 209 remain to provide support to membrane 202 that is floating over cavity 208, and fixed plate 203 can be securely suspended above membrane 202 by a support structure (not shown).

This completes the manufacturing processes of the structure of a MEMS microphone chip. When the MEMS microphone is an integrated microphone, an encapsulation process is needed for encapsulation of the MEMS microphone.

Figure 2F:
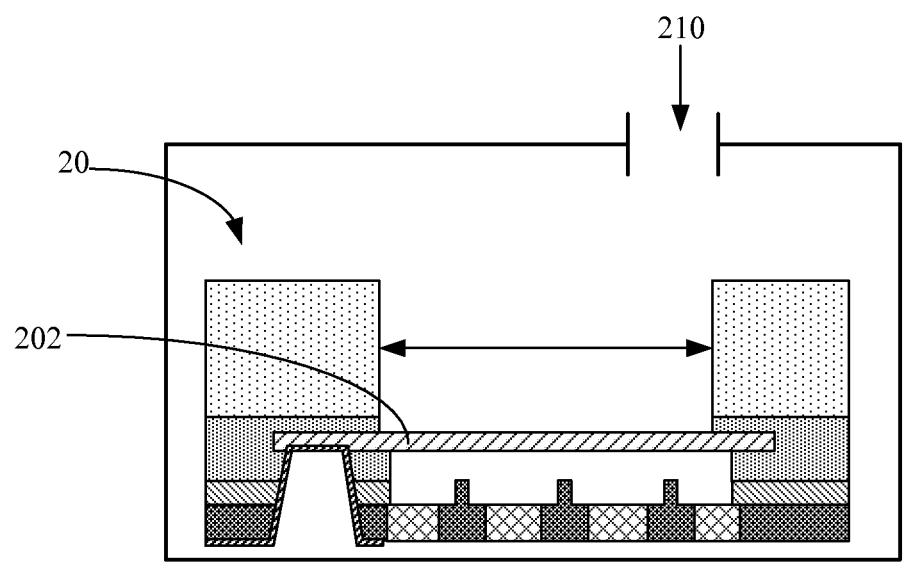

In particular, any suitable process may be used to encapsulate a MEMS chip (die). As shown in FIG. 2F, a package structure may include a housing 220 and a circuit board (not shown). An opening 210 is provided in the housing 220 for receiving an acoustic wave or pressure. A MEMS microphone chip 20 is contained in the package structure. In some embodiment, the package structure may also include an application specific integrated circuit (ASIC) (not shown). MEMS microphone chip 20 includes a membrane 202 that can sense the change in the external sound pressure and converts it to a change in capacitance, which the ASIC can detect and convert into an electric signal. MEMS microphone chip 20 may have the structure of the exemplary MEMS microphone described in the sections above and shown in FIG. 2E.

In summary, according to the present invention, an opening is formed by laser cutting on the back surface of the semiconductor substrate, then the back surface of the semiconductor substrate is etched using a deep reactive ion etching process to form a cavity exposing the membrane. The thus formed cavity of the MEMS microphone has a uniform even side surface to improve the signal to noise ratio and the overall acoustic performance and increase the product yield.

Embodiment 2

Embodiments of the present invention provide a MEMS microphone that is manufactured by the above-described method. The cavity of the thus manufactured MEMS microphone has a smooth surface so that the vibrating membrane can efficiently sense variations in an external sound wave or pressure and convert it to a change in capacitance value. The capacitance value change is then converted into an electric signal and provided to a processor for further processing. In accordance with the present invention, the thus manufactured MEMS microphone has improved signal to noise ratio and good acoustic performance.

Embodiment 3

Embodiments of the present invention further provide an electronic device, which may include an electronic component (e.g., an ASIC) and a MEMS microphone electrically connected to the electronic component. The MEMS microphone can be manufactured according to the method described in the above sections, and thus has good acoustic performance and signal to noise ratio.

In accordance with the present invention, the electronic device may be a mobile phone, a laptop, a netbook, a tablet PC, a game console, a TV, a DVD player, a GPS device, a camera, a voice recorder, MP3, MP4, PSP players, and other semiconductor devices including intermediate products and electronic components that are manufactured using the above-described method to improve performance and yield.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method of manufacturing a micro electromechanical system (MEMS) microphone, the method comprising:
   providing a semiconductor substrate having a front surface and a back surface;
   forming a sacrificial layer on the front surface of the semiconductor substrate;
   forming a membrane within the sacrificial layer;
   forming a fixed plate on the sacrificial layer at a location corresponding to a location of the membrane;
   performing a laser cutting on the back surface of the semiconductor substrate at a location corresponding to an edge region of the fixed plate until a surface of the sacrificial layer is exposed to form an opening surrounding a region of the semiconductor substrate;
   forming a patterned photoresist layer on the back surface of the semiconductor substrate filling the opening;
   removing a portion of the back surface of the semiconductor substrate using the patterned photoresist layer as a mask until the surface of the sacrificial layer and a surface of a portion of the photoresist layer in the opening are exposed to form a cavity; and
   removing a portion of the sacrificial layer disposed above and below a center region of the membrane to form an air gap between the membrane and the fixed plate.

2. The method of claim 1, further comprising, prior to performing the laser cutting:
   defining a laser cut mark on the back surface of the semiconductor substrate, the laser cut mark is configured to mark the location corresponding to the edge region of the fixed plate.

3. The method of claim 1, wherein the laser cutting is performed at a depth in a range between 370 um and 390 um.

4. The method of claim 1, wherein removing the portion of the back surface of the semiconductor substrate comprises a dry etching process.

5. The method of claim 4, wherein the dry etching process is a deep reactive ion etching process.

6. The method of claim 1, wherein the cavity has a cylindrical shape.

7. The method of claim 1, wherein the membrane and the fixed plate each comprise a conductive material.

8. The method of claim 7, wherein the conductive material comprises one or more of aluminum, tungsten, copper, doped polysilicon, amorphous silicon, and silicon germanium.

9. The method of claim 1, wherein the fixed plate comprises a plurality of portions that are spaced apart from each other.

10. The method of claim 9, further comprising:
    forming a stopper structure in the plurality of spaced apart portions of the fixed plate, the stopper structure having a portion extending into the sacrificial layer.

11. The method of claim 1, wherein the opening has a circular shape.

12. The method of claim 1, wherein removing the portion of the sacrificial layer disposed above and below the center region of the membrane comprises a TMAH wet etching process including a TMAH solution having a concentration of 0.1% to 10% by mass, at a temperature in the range between 25° C. to 29° C., and an etch time in a range between about 10 s and about 1000 s.

13. A MEMS microphone manufactured according to claim 1.

14. An electronic device comprising the MEMS microphone according to claim 13.

15. The method of claim 1, further comprising, prior to performing the laser cutting:
    turning over the semiconductor substrate to expose the back surface of the semiconductor substrate;
    defining a laser cut mark on back surface of the semiconductor substrate, the laser cut mark being aligned with an edge of a to-be-defined cavity;
    performing the laser cutting using the laser cut mark as a starting position until the surface of the sacrificial layer is exposed to form the opening.

16. The method of claim 15, wherein the laser cut mark comprises a trench.

17. The method of claim 1, wherein the opening has a width in a range between 3 microns and 5 microns.

18. The method of claim 1, wherein a lateral dimension of a surface of the region of the semiconductor substrate surrounded by the opening is smaller than a lateral dimension of the cavity.

19. The method of claim 1, wherein the patterned photoresist layer fills the opening.

20. The method of claim 1, wherein performing the laser cutting comprises an argon ion beam with a power in the range between 0.4 W and 4 W and at a temperature of about 2000° C.

* * * * *